United States Patent
Väisänen

(10) Patent No.: US 7,937,051 B2
(45) Date of Patent: May 3, 2011

(54) APPARATUS AND METHOD FOR MEASURING THE LEVEL OF RF SIGNALS, AND A TRANSMITTER INCLUDING A WIDE BAND MEASUREMENT CIRCUIT

(75) Inventor: Risto Väisänen, Salo (FI)

(73) Assignee: Nokia Corporation, Espoo (FI)

( * ) Notice: Subject to any disclaimer, the term of this patent is extended or adjusted under 35 U.S.C. 154(b) by 772 days.

(21) Appl. No.: 11/974,009

(22) Filed: Oct. 11, 2007

(65) Prior Publication Data

US 2009/0098840 A1    Apr. 16, 2009

(51) Int. Cl.
*H04B 1/04* (2006.01)

(52) U.S. Cl. .................. 455/115.1; 455/121

(58) Field of Classification Search .......... 455/91, 455/114.1–114.3, 115.1, 126, 127.1, 276.1, 455/121, 122, 124; 330/129, 149
See application file for complete search history.

(56) References Cited

U.S. PATENT DOCUMENTS

| 5,252,929 A * | 10/1993 | Taroumaru ............. 330/129 |
| 6,792,250 B1 | 9/2004 | Zarubin ............. 455/115 |
| 7,693,497 B2 * | 4/2010 | Wilkinson et al. ........ 455/127.1 |
| 2006/0205375 A1 | 9/2006 | Vaisanen ........... 455/276.1 |
| 2007/0207768 A1 | 9/2007 | So et al. ............. 455/403 |

FOREIGN PATENT DOCUMENTS

| EP | 1 133 126 A2 | 9/2001 |
| EP | 1 819 062 A1 | 8/2007 |
| FR | 2 897 740 | 8/2007 |
| KR | 20050000006 | 1/2005 |

* cited by examiner

*Primary Examiner* — Thanh C Le
(74) *Attorney, Agent, or Firm* — Harrington & Smith

(57) ABSTRACT

On a radio frequency signal path a transmission phase shifter causes a phase shift. From a first end of said phase shifter comes a first sample, and from a second end of said phase shifter comes a second sample. Another phase shifter changes the phase of the second sample by the same magnitude as said transmission phase shifter. A measurement circuit combines the phase-shifted second sample with a phase-inverted version of the first sample to produce an output indicative of a power level of the original signal on the radio frequency signal path.

22 Claims, 8 Drawing Sheets

APPARATUS AND METHOD FOR MEASURING THE LEVEL OF RF SIGNALS, AND A TRANSMITTER INCLUDING A WIDE BAND MEASUREMENT CIRCUIT

TECHNICAL FIELD

The invention concerns the technical field of producing controlled radio frequency (RF) transmissions. Especially the invention concerns the technology of measuring levels of RF signals in devices where measurements should be made on a wide frequency range.

BACKGROUND OF THE INVENTION

Measuring the level of an RF signal to be transmitted is important in transmitter devices that have a controllable amplifier section with variable gain, because accurately measuring the level of an amplified RF signal enables controlling the gain of the amplifier section so that it is at an optimal value at all times. In addition to the plain output power coming out of the last amplifier stage the levels of various reflected signals are of interest. For example an impedance mismatch somewhere between the power amplifier output and the antenna of a radio device causes reflections, which are unavoidable in the sense that even if perfect impedance matching at standalone conditions could be achieved, the position of the user's hand as well as the presence of conductive objects near the antenna change its impedance in practically unpredictable ways.

Multiradio is a widely employed overall designation of devices that may include a number of radio transceivers of different communication systems, like difference cellular radio systems, WLAN (Wireless Local Area Network), Bluetooth, and RFID (Radio Frequency Identifier) systems. The frequency ranges of these systems may be very much different from each other, while the constant strive for miniaturization and performance optimization in portable devices calls for combining as much of the transceiver functions, including RF power measurement to shared circuit elements to the largest possible extent.

A conventional way of measuring RF signal levels involves using a directional coupler, an example of which is shown in FIG. 1. The integrated RF circuitry comprises an active part 101 and a passive part 102. Within the active part 101 a radio frequency signal to be transmitted is conducted to a phasing part 103, which produces two versions of the radio frequency signal: a direct phase signal and another having a 90 degrees phase difference. These are separately coupled to the inputs of two parallel controllable amplifiers 104 and 105, which thus produce amplified in-phase and quadrature-phase versions of the radio frequency signal. The differently phased versions are combined in a so-called 3 dB hybrid 106, one output of which is terminated with a terminating impedance 107 while the other is coupled through a low-pass filter 108 and a directional coupler 109 to a load 110. The 3 dB hybrid 106, the terminating impedance 107, the low-pass filter 108 and the directional coupler 109 are located within the passive part 102.

In order to utilise the signal level information available at the directional coupler 109 there are detectors 111 and 112, which are located within the active part 101 and produce indications about the levels of the signals passing through the directional coupler 109, most importantly the output power level of the two-stage amplifier section. The location of the directional coupler 109 in the passive part 102 and the detectors 111 and 112 in the active part 101 necessitates additional connections between the passive and active parts, which is a drawback. To utilize the indications produced by the detectors 111 and 112 their outputs (designated as Vu and Vn in the drawing) are typically conducted to a control circuit, which in turn produces a control voltage Vc which controls the operation of the amplifiers through a controllable voltage source 113.

A major drawback of directional couplers is that they are difficult to implement in reasonable space into an integrated RF circuit. Trying to miniaturize a directional coupler leads usually to unacceptably high losses, poor directivity, too narrow bandwidth, and inaccuracy. It would be possible to compensate for inaccuracies with calibration, but only when impedances are constant. Calibrating a directional-coupler-based solution is not possible when unforeseeable changes occur in impedances, like in the case of the user's hand loading the antenna. Transformer type alternatives to basic directional couplers are known, with inductances and capacitances instead of transmission lines, but they share the same drawbacks related to large space requirements, and other difficulties in integrating with other circuit elements.

Attempts have been made to determine the power level of a signal to be transmitted also without a directional coupler, in some indirect way. Such attempts include measuring e.g. the DC power at the power amplifier, the bias current or the input signal level and trying to make deductions about the power levels at the output. The accuracy of such indirect measurements has been modest at its best.

FIG. 2 illustrates a prior art solution known from the publication US 20060205375 A1. A figuratively described signal generator 201 is adapted to generate a radio frequency signal and to have an output impedance $Z_o$. The radio frequency signal generated by the signal generator 201 is conducted through a load, which may be for example an antenna and which has a load impedance $Z_a$. Between the signal generator 201 and the load there is a measurement circuit having an input 202 and an output 203. Coupled therebetween is a transmission line 204 that produces an exactly 90 degrees phase shift.

The radio frequency signal at the input 202 constitutes the first (in-phase) version of the radio frequency signal. Similarly the radio frequency signal at the output 203 constitutes the second (quadrature) version of the radio frequency signal. The first and second versions are taken to a phase shifter part which here consists of a pair of complementary phase shifters: the first 205 of the pair produces a −45 degrees phase shift, and the second 206 of the pair produces a +45 degrees phase shift. As a result, the two versions of the radio frequency signal have equal phases when they come to an adder 207.

The sum produced at the adder 207 does not depend on the reflection factor at all but only on the level of the original radio frequency signal generated by the signal generator 201. Thus an impedance mismatch between the signal generator 201 and the load does not affect the detection result Vs produced at the detector 208, which is indicative of the magnitude of the sum produced at the adder 207.

The drawback of the solution of FIG. 2 is that it is not easy to find a suitable location on the signal line where the exact 90 degrees phase shift would take place, and even if one is found, the required accuracy in the phase shift typically applies over a relatively narrow frequency range only. This problem becomes very prominent in multiradio devices, because the frequency range to be covered may be much wider than in conventional cellular phones where only the cellular channels need to be covered.

SUMMARY OF THE INVENTION

The present invention aims at presenting a method and a measurement circuit for measuring the level of an RF signal, especially so that the accuracy of the measurement is good also under varying load impedance conditions and over a wide frequency range. The invention aims also at presenting a solution which is easily applicable for integration with other RF circuits, and which allows sharing measurement circuitry between different transceiver parts. Additionally the invention aims at presenting a transmitter device in which the method and measurement circuit are utilized to optimize the structure and operation of the device.

The objectives of the invention are achieved by taking two versions of the RF signal with a phase difference between them, inverting the phase of one version, doubling said phase difference in the other version, and using the manipulated signals so obtained to produce an indication of the required RF signal level.

An apparatus according to the invention comprises:
  a radio frequency signal path,
  as a part of said radio frequency signal path a transmission phase shifter,
  a measurement circuit,
  a first coupling between a first end of said transmission phase shifter and the measurement circuit,
  a second coupling between a second end of said transmission phase shifter and the measurement circuit, and
  as a part of said second coupling a first phase shifter dimensioned to produce a phase shift of same magnitude as said transmission phase shifter;
wherein the measurement circuit is configured to combine a signal coming through said second coupling with a phase-inverted version of a signal coming through said first coupling to produce a first output signal indicative of a power level of a first radio frequency signal on said radio frequency signal path.

The invention applies also to a transmitter device, which comprises:
  a first radio frequency signal path,
  as a part of said first radio frequency signal path a first transmission phase shifter,
  a second radio frequency signal path,
  as a part of said second radio frequency signal path a second transmission phase shifter dimensioned to produce a phase shift of same magnitude as said first transmission phase shifter,
  a measurement circuit,
  a first coupling between a first end of said first transmission phase shifter and the measurement circuit,
  a second coupling between a second end of said first transmission phase shifter and the measurement circuit,
  as a part of said second coupling a first phase shifter dimensioned to produce a phase shift of same magnitude as any of said first and second transmission phase shifters,
  a third coupling between the first end of said first transmission phase shifter and a first end of said second transmission phase shifter, said third coupling having an electrical length, and
  a fourth coupling between the second end of said first transmission phase shifter and a second end of said second transmission phase shifter, said fourth coupling having an electrical length equal to the electrical length of said third coupling;
wherein the measurement circuit is configured to combine a signal coming through said second coupling with a phase-inverted version of a signal coming through said first coupling to produce a first output signal indicative of a power level of a first radio frequency signal on one of said first and second radio frequency signal paths.

Additionally the invention applies to a chipset for use in a transmitter device, comprising:
  a measurement circuit,
  a first coupling between a first end of a transmission phase shifter and the measurement circuit,
  a second coupling between a second end of said transmission phase shifter and the measurement circuit, and
  as a part of said second coupling, connections to a first phase shifter dimensioned to produce a phase shift of same magnitude as said transmission phase shifter;
wherein the measurement circuit is configured to combine a signal coming through said second coupling with a phase-inverted version of a signal coming through said first coupling to produce a first output signal indicative of a power level of a first radio frequency signal going through said transmission phase shifter.

Additionally the invention applies to a method, which comprises:
  sampling a radio frequency signal to produce a first sampled version of the radio frequency signal,
  phase-shifting said radio frequency signal and sampling the phase-shifted radio frequency signal to produce a second sampled version of the phase-shifted radio frequency signal,
  replicating the phase-shifting of said radio frequency signal for said second sampled version, thus producing a phase-shifted second sampled version, and
  combining said phase-shifted second sampled version with a phase-inverted version of said first sampled version of the radio frequency signal, to produce a first output signal indicative of a power level of said radio frequency signal.

The task of obtaining two differently phased versions of an RF signal becomes a lot easier if one loosens the requirement of exactly 90 degrees phase difference, which was typical to prior art. Also it is known that a phase inverter can be implemented so that its operation is essentially independent of frequency. Such a frequency-independent phase inverter can be coupled to receive one of said two differently phased versions of the RF signal of interest. Whatever the phase difference between two versions was originally, it can be replicated in a frequency-independent manner by directing the other version once more through a similar component or transmission line that caused the original phase difference. A combination of the manipulated signals so obtained contains information about the power level of the original RF signal in a form from which all dependency of frequency can be essentially removed.

Contrary to prior art solutions, the solution according to the invention allows using calibration to compensate for error factors internal to the circuit. Various possibilities are available for implementing the calibration, including but not being limited to tuning the balance of a differential amplifier used in the phase inversion and detection circuitry, and using a programmable passive attenuator in combination with the active components.

The exemplary embodiments of the invention presented in this patent application are not to be interpreted to pose limitations to the applicability of the appended claims. The verb "to comprise" is used in this patent application as an open limitation that does not exclude the existence of also unrecited features. The features recited in depending claims are mutually freely combinable unless otherwise explicitly stated.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

DETAILED DESCRIPTION OF ADVANTAGEOUS
EMBODIMENTS OF THE INVENTION

Figure 1:
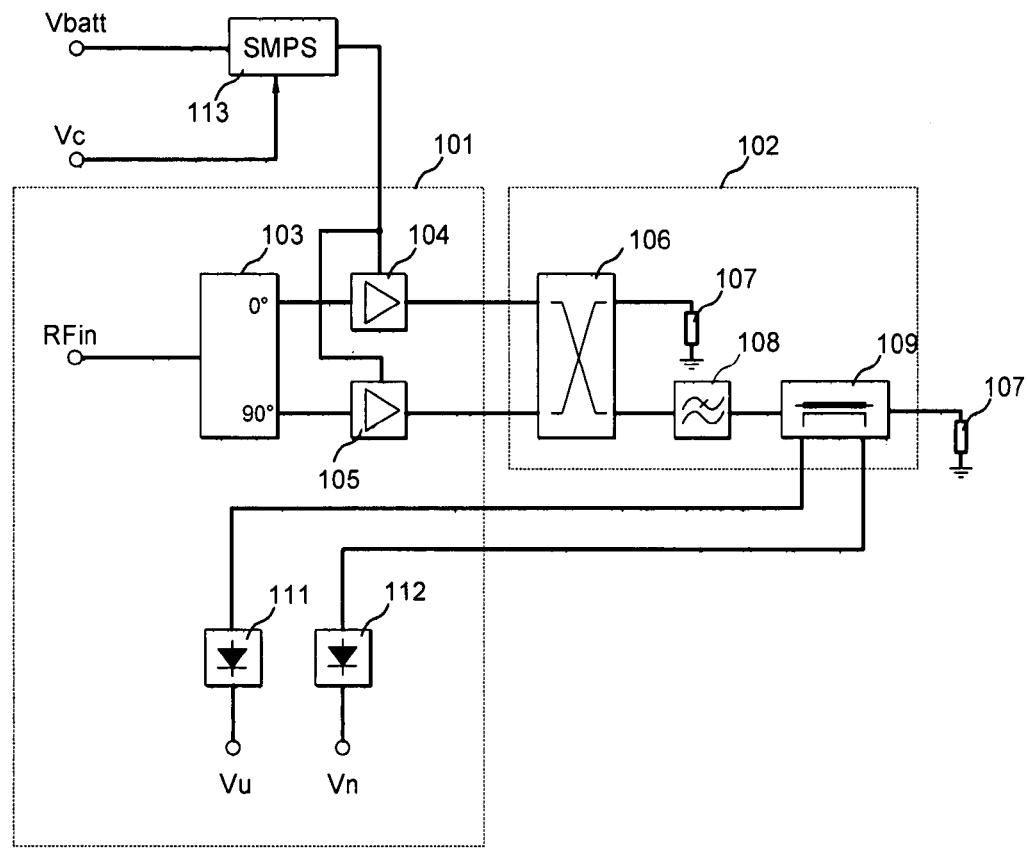
FIG. 1 illustrates a known solution based on a directional coupler.
Figure 2:
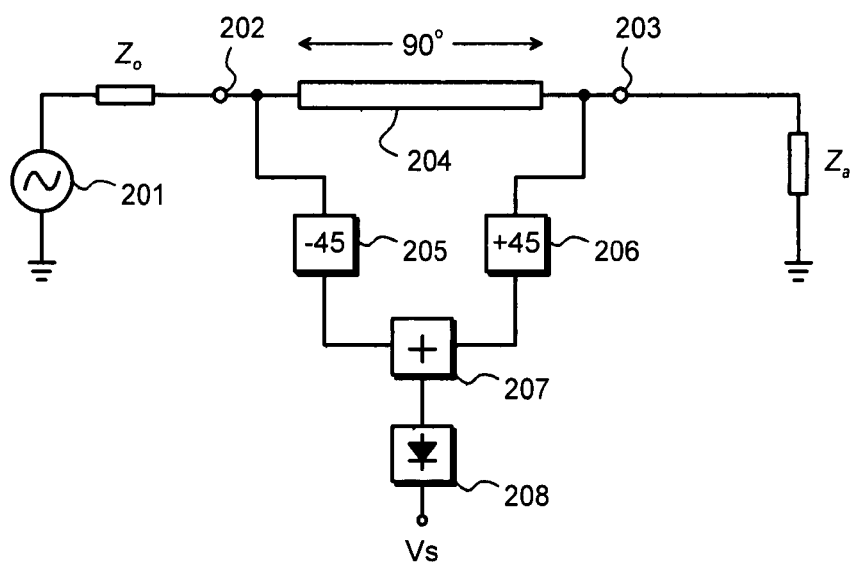
FIG. 2 illustrates a known solution based on phase shifting and combined detection.
Figure 3:
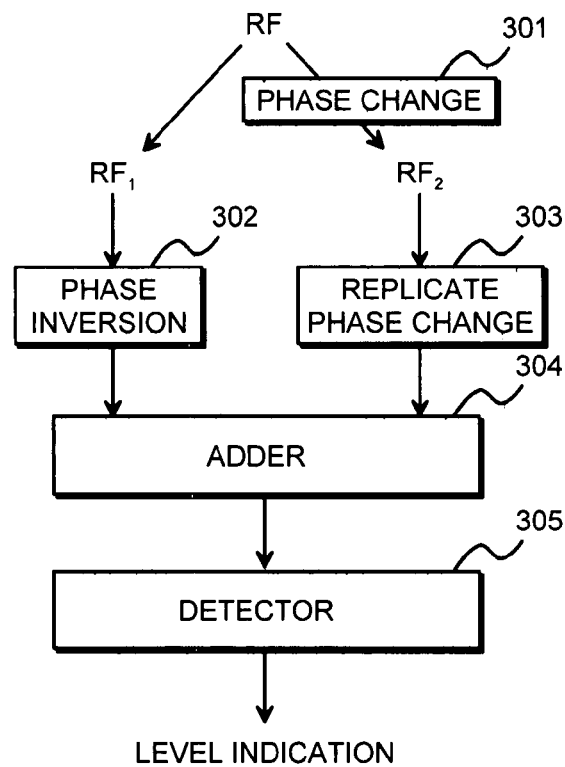
FIG. 3 illustrates a principle according to an embodiment of the present invention.

FIG. 3 can be considered either as a description of a method or as a block diagram of a hardware implementation. In FIG. 3 we assume that there exists a radio frequency signal RF. What we call a first version of the RF signal in the following is essentially the signal itself, or a sample taken from it through a suitable sampling connection. A second version of the RF signal is produced by subjecting the original RF signal to a phase change 301 (and preferably taking a sample therefrom). For the time being we do not need to make any assumption about the magnitude of the phase change 301.

The phase of the first version of the RF signal is inverted in the step schematically shown as phase inversion 302. It is widely known that a phase inversion can be made in a frequency-independent manner, for example by using a transformer or an inverting amplifier stage. The phase of the second version is also changed, but by a magnitude that is equal to the phase change 301 that was originally used to produce the second version. We may say that at the block schematically shown as 303 the phase change of the second version is essentially replicated. Changing the phase at steps 301 and 303 does not need to be frequency-independent, as long as both phase changes are equal to each other at any given frequency.

The step schematically shown as 304 illustrates combining the outputs of the phase inversion step 302 and the phase change replication step 303. This combined result is taken to a detector at step 305, and it is subjected to detection and measurement that reveals the power level of the original RF signal.

Figure 4A:
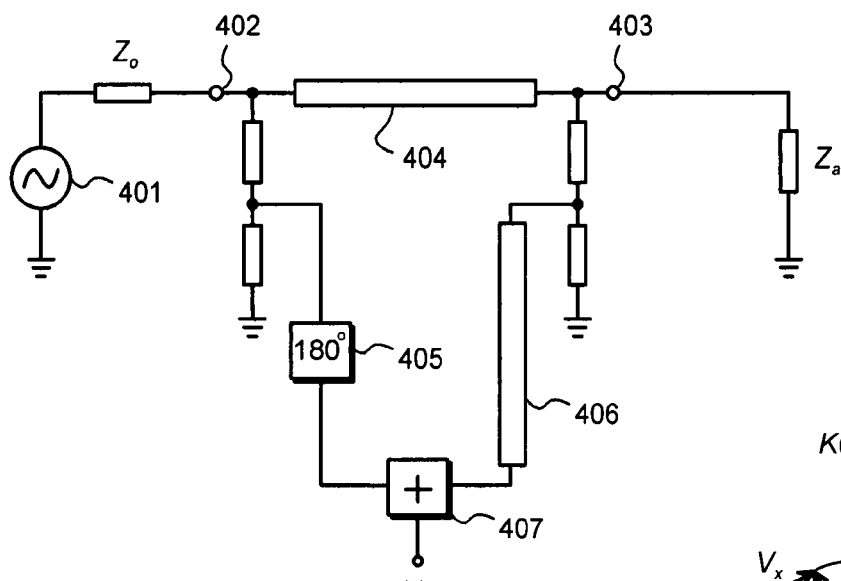
FIG. 4a illustrates a more practically oriented example of an embodiment of the invention.

FIG. 4a illustrates a more practically oriented implementation of the principle illustrated above in FIG. 3. A figuratively described signal generator 401 is adapted to generate a radio frequency signal and to have an output impedance $Z_o$. The radio frequency signal generated by the signal generator 401 is conducted through a load, which may be for example an antenna and which has a load impedance $Z_a$. Between the signal generator 401 and the load there is a measurement circuit having an input 402 and an output 403. Coupled therebetween is a phase shifter, which in FIG. 4a is schematically illustrated as a transmission line 404. In order not to cause confusion with designations we may also designate the transmission line 404 as the "transmission phase shifter", because it causes a phase shift to the radio frequency transmission.

Physically the transmission phase shifter may be a transmission line on a circuit board, or it may be for example some part of an impedance matching network coupled between a transmitter circuit and an antenna or between some other parts of the transmitter where impedance matching is needed.

In order to produce a first version of the radio frequency signal at the input 402, an ordinary resistive attenuation network is used, which consists of two resistors coupled in series between the input 402 and ground. A signal taken between said resistors constitutes the first version of the radio frequency signal. Similarly the radio frequency signal at the output 403 is sampled with a corresponding resistive attenuation network to produce a second version of the radio frequency signal.

The first version is taken to a phase inverter 405, and the second version is directed to a phase shifter, which here is a transmission line 406, the electric length of which is exactly equal to the electric length of the transmission line 404 used as the transmission phase shifter. This causes the phase change replication referred to at step 303 of FIG. 3. Outputs of the phase inverter 405 and the transmission line 406 are coupled to an adder 407. What appears conceptually as an adder 407 in FIG. 4a can in practice be simply a connection of the outputs of the phase inverter 405 and the transmission line 406.

The following mathematical example illustrates the operation of the circuit of FIG. 4a. Let us first assume that the transmission line 404 has an impedance $Z_m$ equal to 50 ohms and an electric length equal to 30 degrees. The electric length of the transmission line 406 is thus also 30 degrees. Let us further assume that an RF signal, the magnitude of which equals 1 volt, appears at points 402 and 403, when impedance matching is perfect and the output and load impedances $Z_o$ and $Z_a$ are also 50 ohms. As a phase reference we assume the RF signal to have a phase equal to zero degrees at point 402. Thus the RF signal at point 403 has a phase of −30 degrees, and the sample taken through the transmission line 406 has a phase of −60 degrees. As a simplification we assume that the resistive networks do not attenuate the signal or change its phase.

With these assumptions the voltage coming through the phase inverter 405 is 1 V at a phase −180 degrees. The output Vs of the adder 407 is $$V_S = 1V\angle-180° + 1V\angle-60°$$
$$= 1V \cdot \cos(-180) + j \cdot 1V \cdot \sin(-180) +$$
$$1V \cdot \cos(-60) + j \cdot 1V \cdot \sin(-60)$$
$$= 1V\angle-120°$$

Let us them assume that the load impedance has some other, arbitrary value. In order to keep the numerical example as simple as possible we select the value $Z_a$=16.7 ohms. It is easy to show that the conclusions will be the same, regardless of which (realistic) load impedance value is selected.

The reflection coefficient K at point 403 is $$K = \frac{Z_a - Z_m}{Z_a + Z_m} = \frac{16.7 - 50}{16.7 + 50} = -0.5$$

Figure 4B:
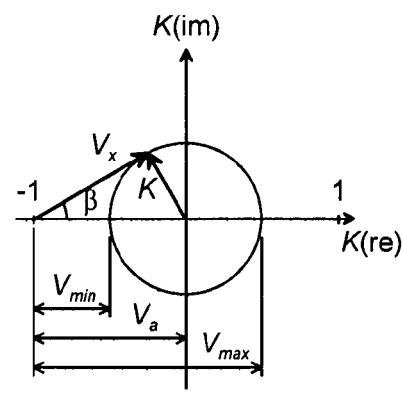
FIG. 4b illustrates the mathematical dependencies of certain quantities.

In polar notation this result would be expressed as K=0.5∠180°. FIG. 4b shows how the amplitude $V_x$ and phase β of the voltage in the transmission line depend on the magnitude and phase angle of the reflection coefficient K. The voltage $V_a$ corresponds to the voltage value when K equals zero; in this exemplary case thus $V_a$=1V. At the load-side end (i.e. at point 403) the phase angle of the reflection coefficient is 180 degrees, corresponding to a voltage minimum $V_{min}$. Its value can be calculated as $$V_{min} = 1V \cdot (1-|K|) = 0.5V$$

Remembering that the transmission lines 404 and 406 both cause a 30 degrees shift in phase, we may say that the voltage coming to adder 407 through transmission line 406 is 0.5 volts with a phase −60 degrees.

In order to determine the reflection coefficient at point 402 we calculate first, what is the impedance $Z_x$ looking into the direction of the load:

$$Z_x = \frac{Z_a \cdot \cos(30°) + j \cdot Z_m \cdot \sin(30°)}{\cos(30°) + j \cdot \frac{Z_a}{Z_m} \cdot \sin(30°)} = 32.7\Omega\angle 49.1°$$

We may further derive the reflection coefficient at this point:

$$K = \frac{Z_x - Z_m}{Z_x + Z_m} = 0.5\angle 120°$$

Looking at FIG. 4b and applying basic trigonometric rules, we get $V_x$=0.866 V and β=30 degrees.

The phase inverter 405 causes a phase shift equal to −180 degrees, which means that the voltage arriving through it to the adder 407 is 0.866 V at phase −150 degrees. Above we have shown that the other input to the adder is 0.5 V at phase −60 degrees. The output Vs of the adder 407 can be calculated as $$V_S = 0.866V\angle-150° + 0.5V\angle 60°$$
$$= 0.866V \cdot \cos(-150°) + j \cdot 0.866 \cdot \sin(-150°) +$$
$$0.5V \cdot \cos(-60°) + 0.5V \cdot j \cdot \sin(-60°)$$
$$= -0.75V - j \cdot 0.433V + 0.25V - j \cdot 0.433V$$
$$= 1V\angle-120°$$

This is exactly the same as in the case of perfect impedance matching. It is straightforward to show that the deduction made above is valid for all realistic load impedance values. We may conclude that the level of the original RF signal affects the output of the adder, while the degree of impedance mismatch does not.

The amplitude of the signal Vs obtained at the output of the adder depends on the amplitude of the original radio frequency signal generated by the signal generator 401 and on the magnitude of the phase shift caused by the transmission phase shifter (transmission line 404), but not on the potential impedance mismatch that is causing reflections from the load $Z_a$. We may deduce that an impedance mismatch between the signal generator 401 and the load does not affect the detection result that can be produced by measuring the amplitude of the signal Vs produced at the adder 407.

Figure 5:
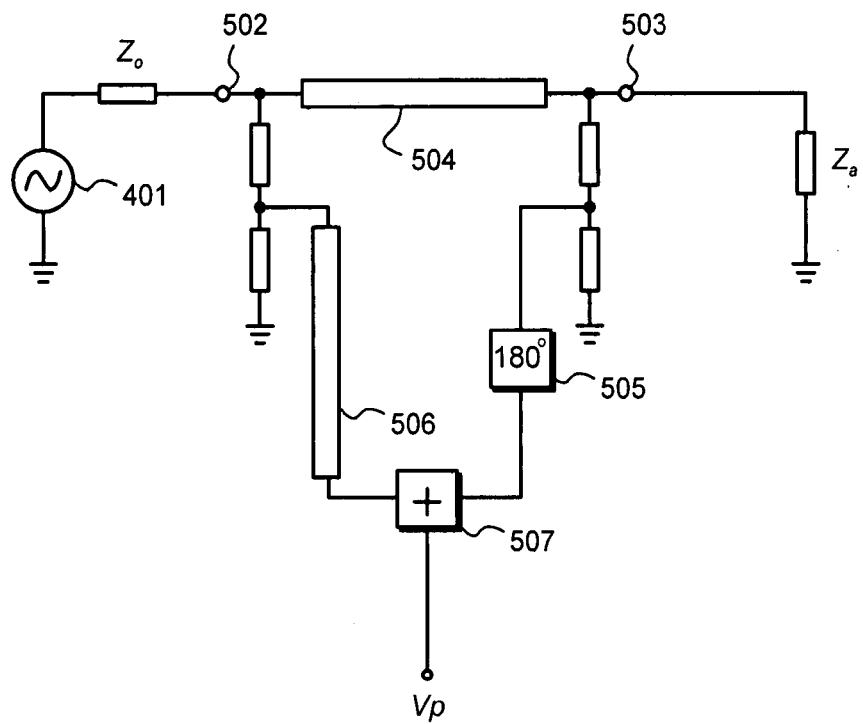
FIG. 5 illustrates a further embodiment of the invention.

FIG. 5 illustrates the application of the same principle for measuring the power level of a reflected signal. The signal generator 401, the load, and the impedances $Z_o$ and $Z_a$ are the same as before. Since a reflected signal propagates from right to left in the drawing, the first version of the (reflected) RF signal is now obtained at the output 503 and the second version is obtained at the input 502. The phase inverter 505 inverts the phase of the first version, and the transmission line 506 replicates the phase shift caused by transmission line 504. The adder 507 produces a signal Vp, the amplitude of which is indicative of the power level of the reflected signal.

An exemplary numerical analysis of the situation in FIG. 5 goes in the following way. With the same initial assumptions as in the case of FIG. 4a above an exact impedance matching would result in two signals of equal magnitude coming to adder 507 at phases −30 degrees and 150 degrees. As signals of equal magnitude and opposite phase cancel each other, adder 507 produces a zero output signal, which conforms to what is commonly known about perfect impedance matching: there is no such thing as reflected power.

If the load impedance $Z_a$ is changed to the same exemplary value of 16.7 ohms as in the discussion above, it is straightforward to show that the signals coming to adder 507 are 0.866 V at zero degrees and 0.5 V at 150 degrees. The output Vp is calculated as $$V_p = 0.866V\angle 0° + 0.5V\angle 150°$$
$$= 0.866V \cdot \cos(0°) + j \cdot 0.866 \cdot \sin(0°) +$$
$$0.5V \cdot \cos(150°) + 0.5V \cdot j \cdot \sin(150°)$$
$$= 0.866V + j \cdot 0V + 0.5V * (-0.866) + j \cdot 0.5V \cdot 0.5$$
$$= 0.866V + j \cdot 0V - 0.4335V + j \cdot 0.25V$$
$$= 0.5V\angle 30°$$

The reflection factor (i.e. the extent of impedance mismatch) has an effect on the amplitude of the signal Vp, but in a frequency-independent manner, as will be shown below.

Figure 6:
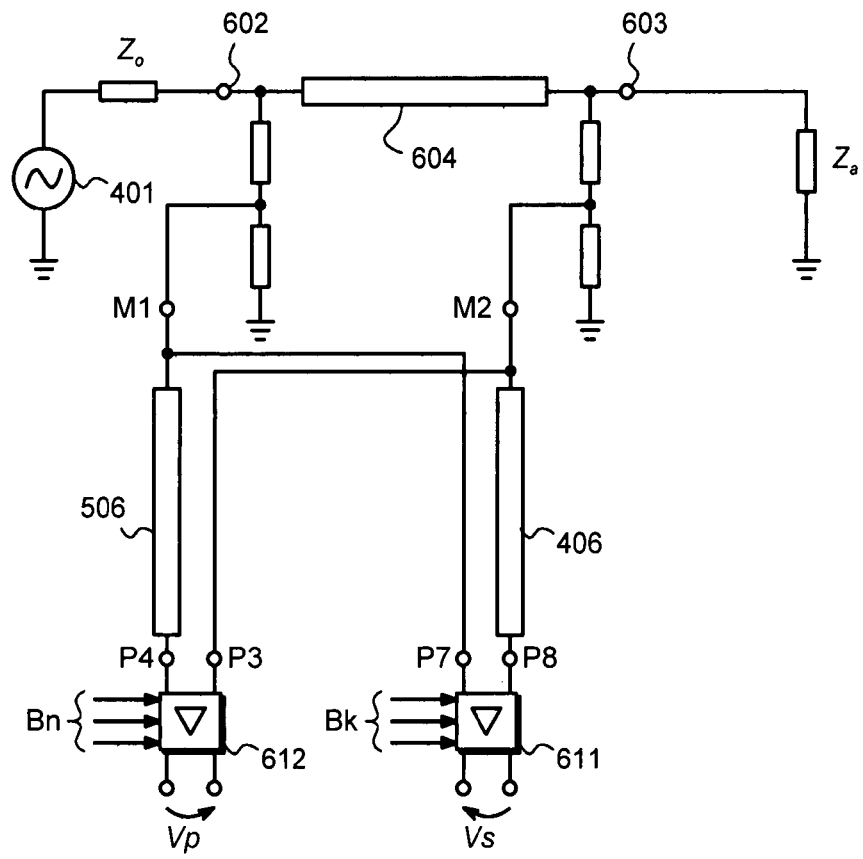
FIG. 6 illustrates a possible practical implementation of an embodiment of the invention.

FIG. 6 illustrates combining the principles of FIGS. 4a and 5. The input and output of the measurement circuit are now designated as 602 and 603 respectively, and between them there is a transmission phase shifter 604 with a separate resistive sampling network connected to both ends. Point M1 illustrates the connection point from the sampling network on the signal source side to a measurement circuit, and point M2 illustrates respectively the connection point from the sampling network on the load side to a measurement circuit. Transmission lines may exist (but are not shown here) between each sampling network and its corresponding M-point; as long as both such transmission lines are equal in electric length, they do not have any influence to the operation of the measurement circuitry.

The measurement signal Vs, the amplitude of which is proportional to the power level of the transmitted signal, is formed in amplifier 611. A direct connection exists between point M1 and an inverting input of the amplifier 611, so that effectively the first version of the sampled signal undergoes phase inversion. Between point M2 and a non-inverting input of the amplifier 611 is the phase shifter 406, the electric length of which is equal to the electric length of the transmission phase shifter 604, so that the second version of the sampled signal arrives at the amplifier 611 appropriately shifted in phase. The use of words "first version" and "second version" conforms here to their use in the description of FIG. 4a. The inputs illustrated as Bk relate to calibration and will be described in more detail later.

The measurement signal Vp, the amplitude of which is proportional to the power level of the reflected signal, is formed in amplifier 612. Concerning the formulation of signal Vp we note that the designation of "first version" and "second version" of the sampled signal must now conform to the use of these concepts in the description of FIG. 5 above. A direct connection exists between point M2 and an inverting input of the amplifier 612, so that effectively what is now the first version of the sampled signal undergoes phase inversion. Between point M1 and a non-inverting input of the amplifier 612 is the phase shifter 506, the electric length of which is equal to the electric length of the transmission phase shifter 604, so that the signal now called the second version of the sampled signal arrives at the amplifier 612 appropriately shifted in phase. The inputs illustrated as Bn relate to calibration.

At this same impedance mismatch conditions the signal Vs is 1 V at −120 degrees as was shown above. We may calculate the reflection coefficient K from the voltage signals:

$$K = \frac{Vp}{Vs} = \frac{0.5V \angle 30°}{1V \angle -120°} = 0.5 \angle 150°$$

In the description of FIG. 4a we derived the values of K at the ends of the transmission phase shifter, and got the results K=0.5∠180° at point 403 and K=0.5∠120° at point 402. The K value calculated from the measurement signals is equal in magnitude and has a phase that is at the mean value between the K values calculated from the impedances.

From the adder output signals Vp and Vs it is also possible to calculate the reflection loss RL as $$RL = -20\log_{10}\left(\frac{Vp}{Vs}\right) = -20\log_{10}\left(\frac{0.5V}{1V}\right) = 6 dB$$

and the voltage standing wave ratio VSWR as $$VSWR = \frac{Vs + Vp}{Vs - Vp} = \frac{1V + 0.5V}{1V - 0.5V} = 3$$

Figure 7:
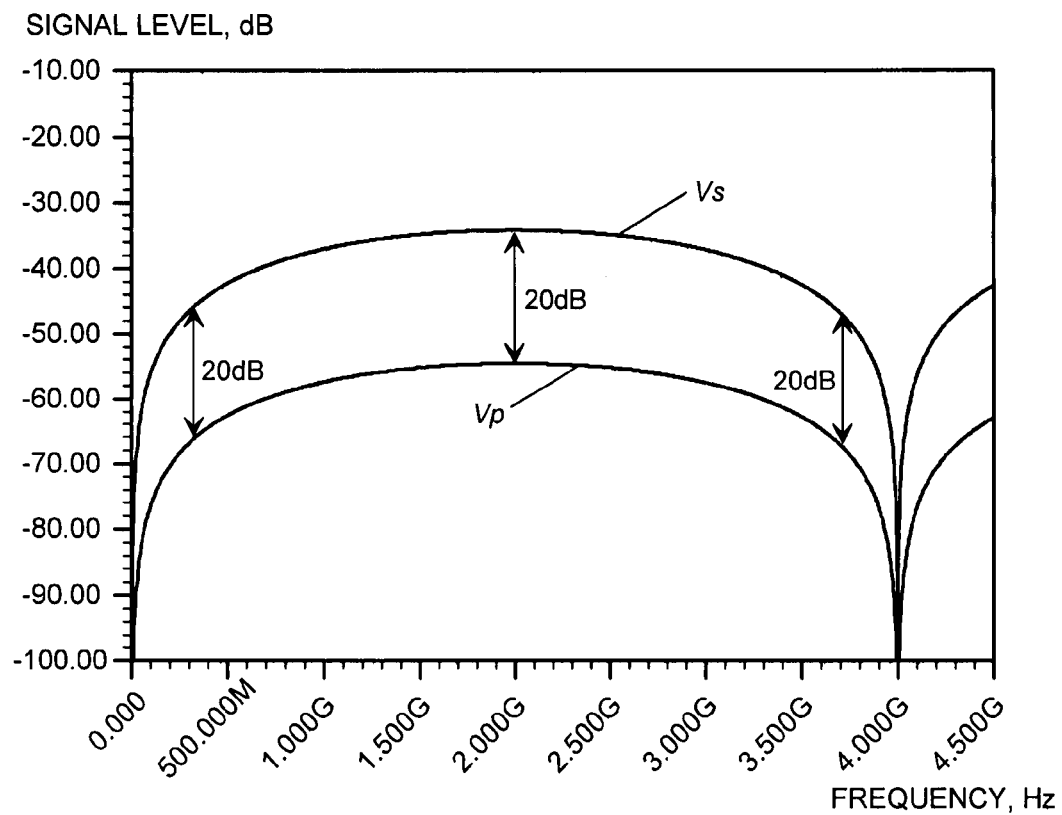
FIG. 7 illustrates a simulation result calculated for an embodiment of the invention.

FIG. 7 illustrates results obtained by simulating the operation of a circuit according to FIG. 6 with APLAC simulation software. The simulation model was configured to have a signal generator impedance $Z_o$ equal to 50 ohms, an impedance of the transmission phase shifter 604 likewise equal to 50 ohms, and a load impedance $Z_a$ equal to 41 ohms (indicating a deliberately caused slight impedance mismatch). The transmission phase shifter was dimensioned to give a 90 degrees phase shift at the frequency of 2 GHz. The VSWR (Voltage Standing Wave Ratio) is 50/41=1.22, the reflection coefficient S11 is 0.1, and the absolute value of the return loss, calculated as RL=|20·log 10|S11||db, is 20 dB. Simulation shows that the return loss value is independent from frequency. None of the measurement signals Vs or Vp as such is independent from frequency, as can be seen from the curved form of the graphs, but this was known already from the fact that the electric length of the phase-shifting transmission lines and thus the phase-shifting effect is dependent on frequency, while the phase inversion operation is not. On the other hand, since the electric length of a transmission line is a well determined function of frequency, the curving default behaviour of the resulting Vs and Vp values can be stored in a memory based on measurements made beforehand. Later, when a measurement is made and the actual transmission frequency is known, the measured values can be compared to the corresponding values read from the memory.

Figure 8:
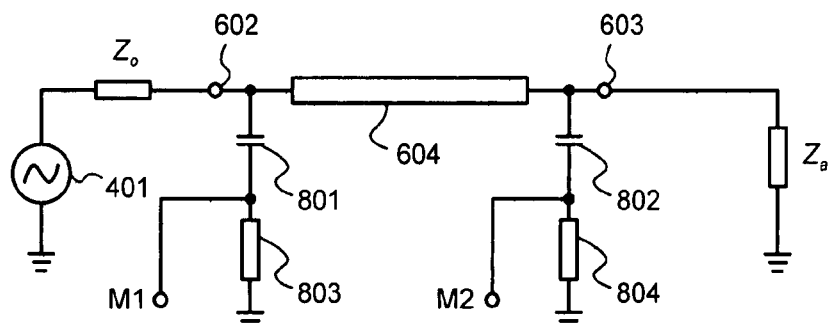
FIG. 8 illustrates an alternative way of taking the RF signal versions in an embodiment of the invention.

FIG. 8 illustrates the possibility of replacing the above-described resistive sampling networks with series connections of a capacitive component and a resistive component. The components illustrated as capacitors 801 and 802 in FIG. 8 may be ordinary discrete components mounted on a circuit board, or they may implemented as specifically formed conductive traces on a circuit board. A very simple alternative is to utilize the stray capacitance between a transmission line, that forms a part of the transmission phase shifter 604, and solder pads used at the terminals of the resistors 803 and 804. We may note that these resistors act as the terminating resistances of the transmission lines that go from the sampling point to the active parts of the power level measurement circuitry. As such, resistive components like 803 and 804 can be implemented for examples as discrete resistors mounted on a circuit board, integrated resistors located inside a multi-layer circuit board, or printed circuit resistors (like polymer thick film patches) manufactured as a part of a circuit board.

An important difference between a circuit according to an embodiment of the invention and power level measurement circuits according to prior art is the possibility of employing calibration to further enhance the accuracy of the measurement. Changing the balance of a differential amplifier is a technique known as such. Typically it involves conducting one or more control signals to the differential amplifier, choosing suitable voltage values to said control signals, and using them to bias one or more active components inside the differential amplifier. Examples of such control signals are shown in FIG. 6 as Bn and Bk.

Figure 9:
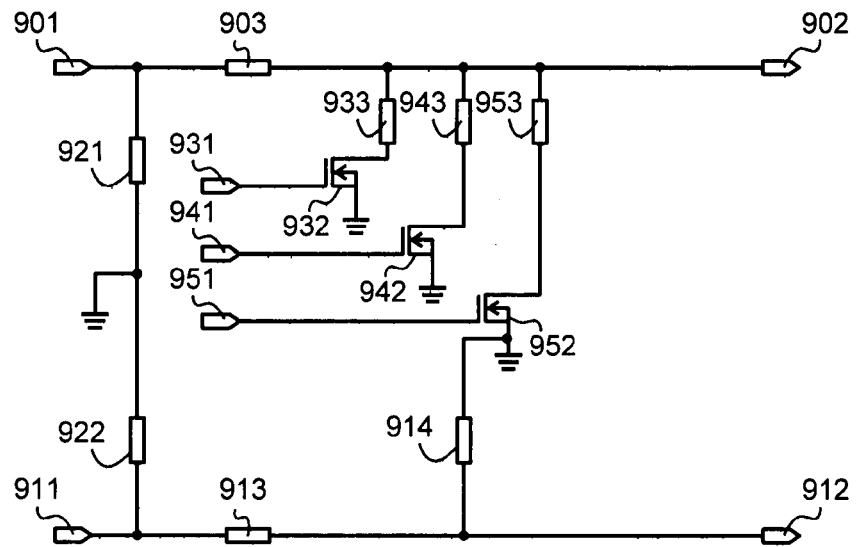
FIG. 9 illustrates a programmable passive attenuator for use in an embodiment of the invention.

FIG. 9 illustrates an alternative way of implementing calibration. The circuit of FIG. 9 is a programmable passive attenuator, which could be coupled e.g. before the input of a differential amplifier; see points P3 and P4 as well as points P7 and P8 of FIG. 6. The programmable passive attenuator of FIG. 9 has a first input 901 and a first output 902, and connected between them a first series resistor 903. It has also a second input 911 and a second output 912, and connected between them a second series resistor 913. Resistors 921 and 922 are connected between the first input 901 and ground and between the second input 911 and ground respectively, and constitute terminating impedances for the transmission lines leading from the sampling networks to the programmable passive attenuator. There are three control inputs 931, 941, and 951, each of which is coupled to the gate of a corresponding switch transistor 932, 942, and 952. Depending on the gate voltage, each switch transistor either opens or closes a resistive connection from the line between the series resistor 903 and the first output to ground. The resistances 933, 943, and 953 of said resistive connections are different, while from the line between the series resistor 913 and the second output there is a constant resistive connection 914 to ground. Using the notation of FIG. 6, the control signals illustrated as Bk or Bn could be connected to the control inputs 931, 941, and 951 of the corresponding programmable passive attenuator. Exemplary resistive impedance values could be 903=913=100 ohms, 914=1.2 kiloohms, 921=922=30 ohms, 933=4 kiloohms, 943=2 kiloohms, 953=1 kiloohm.

FIG. 6 illustrated the use of differential amplifiers 611 and 612 with balanced inputs and outputs. As an alternative, the arrangement of FIG. 10 could be used, based on amplifiers with unbalanced inputs and balanced outputs. Connection points P3, P4, P7, and P8 show where the arrangement of FIG. 10 can be coupled to replace the amplifiers 611 and 612 of FIG. 6. Next to each pair of connection points there is an impedance matching network that consists of the terminating impedances for the transmission lines leading from the upper part of FIG. 6 to these connection points. The middle terminal between each pair of connection points in FIG. 10 is the ground terminal for the transmission lines (for which no counterpart is shown in FIG. 6 for graphical clarity).

Figure 10:
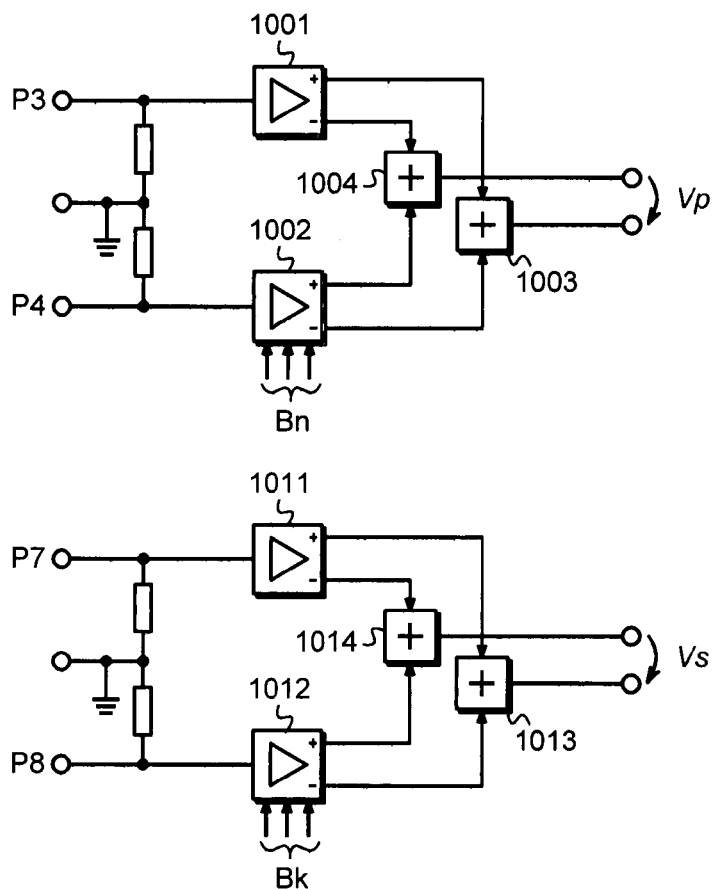
FIG. 10 illustrates the use of amplifiers with balanced outputs in an embodiment of the invention.

In the upper part of FIG. 10, the first version of the sampled reflected signal comes to connection point P3 and enters amplifier 1001, and the second (phase-shifted) version of the sampled reflected signal comes to connection point P4 and enters amplifier 1002. The positive output of amplifier 1001 and the negative output of amplifier 1002 are summed in adder 1003, the output of which constitutes a first terminal of the output that exhibits the measurement signal Vp. The negative output of amplifier 1001 and the positive output of amplifier 1002 are summed in adder 1004, the output of which constitutes a second terminal of the output that exhibits the measurement signal Vp.

In the lower part of FIG. 10, the first version of the sampled transmitted signal comes to connection point P7 and enters amplifier 1011, and the second (phase-shifted) version of the sampled transmitted signal comes to connection point P8 and enters amplifier 1012. The positive output of amplifier 1011 and the negative output of amplifier 1012 are summed in adder 1013, the output of which constitutes a first terminal of the output that exhibits the measurement signal Vs. The negative output of amplifier 1011 and the positive output of amplifier 1012 are summed in adder 1014, the output of which constitutes a second terminal of the output that exhibits the measurement signal Vs.

Calibration of the arrangement shown in FIG. 10 can be done with control inputs to suitably selected ones of the amplifiers. In this graphical representation the control inputs come to amplifiers 1002 and 1012. As an alternative, other calibration means such as programmable attenuators like that in FIG. 9 could be used.

Figure 11:
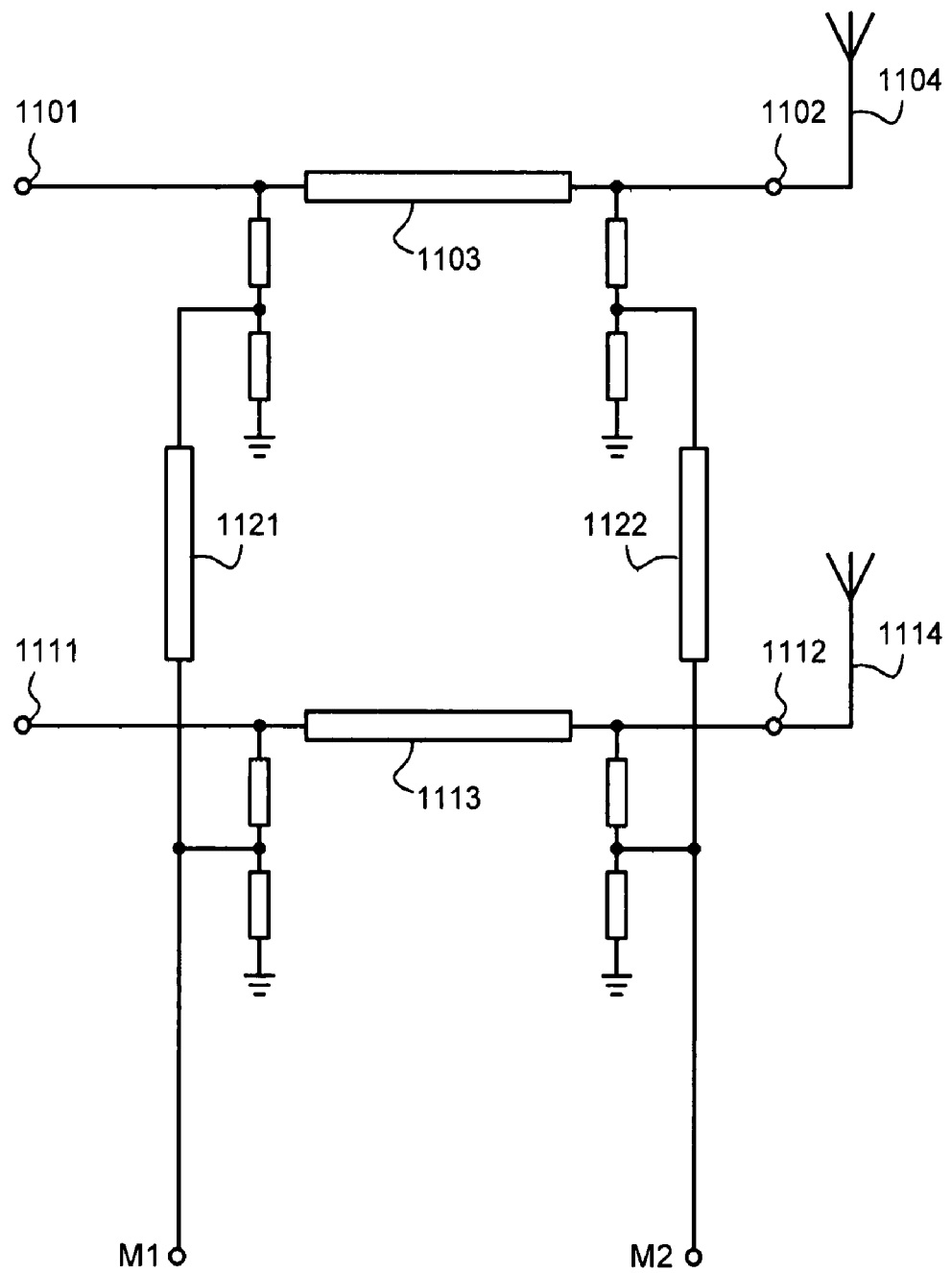
FIG. 11 illustrates combining measurement circuitry according to an embodiment of the invention.

The fact that the electrical length of the transmission phase shifter does not have to be in any fixed relation to the wavelength on the actual transmission frequency allows sharing major parts of the measurement arrangement between transmitter arrangements of different communication systems. FIG. 11 illustrates an arrangement in which the transmitter arrangement of a first communication system comprises a first RF power amplifier output port 1101, a first antenna port 1102 and between them a first transmission phase shifter 1103. A first antenna 1104 is coupled to the first antenna port 1102. The transmitter arrangement of a second communication system, which co-exists in the same communications device, comprises a second RF power amplifier output port 1111, a second antenna port 1112 and between them a second transmission phase shifter 1113, the electrical length of which is equal to the electrical length of the first transmission phase shifter 1103. A second antenna 1114 is coupled to the second antenna port 1112.

At both ends of both the first and the second transmission phase shifter there are sampling networks, which here are resistive sampling networks. The middle points of the sampling networks are connected so that a first transmission line 1121 connects together the middle points of the sampling networks on the side of the RF power amplifier ports, and a second transmission line 1122 connects together the middle points of the sampling networks on the side of the antenna ports. The transmission lines 1121 and 1122 are equal in electric length, but their electric length does not need to be the same as the electric length of the transmission phase shifters 1103 and 1113.

From the middle points of the sampling networks in the transmitter arrangement of a second communication system there are connections to the circuit points M1 and M2 respectively, which shows how the arrangement of FIG. 11 could replace the upper part of the arrangement of FIG. 6 for example. Since the transmission lines that lead from points M1 and M2 towards the active parts of the measurement circuit (shown as 406 and 506 in FIG. 6; not shown in FIG. 11) must replicate the phase shift caused by the transmission phase shifters 1103 and 1113, such transmission lines must again have an electrical length equal to that of the transmission phase shifters 1103 and 1113. Proper impedance matching must be accounted for in dimensioning the sampling networks, the transmission lines 1121 and 1122, and the connections from them towards the active parts of the measurement circuit. Sharing parts of the measurement circuitry between the transmitter arrangements of two communication systems, like in FIG. 11, is naturally only possible, if these two systems do not require producing transmissions simultaneously.

The invention does not limit the implementation of the detectors used to detect the measurement signals, which above have been designated as Vp and Vs. Any suitable detectors can be used, including but not being limited to diode detectors, detectors implemented with a mixer and a phaser, or detectors based on a logarithmic amplifiers. Similarly the implementations of phasing and summing functions that have been shown based on completely passive components are exemplary only; a variety of alternative ways, including the use of active components, exist and are known for implementing similar functions.

Figure 12:
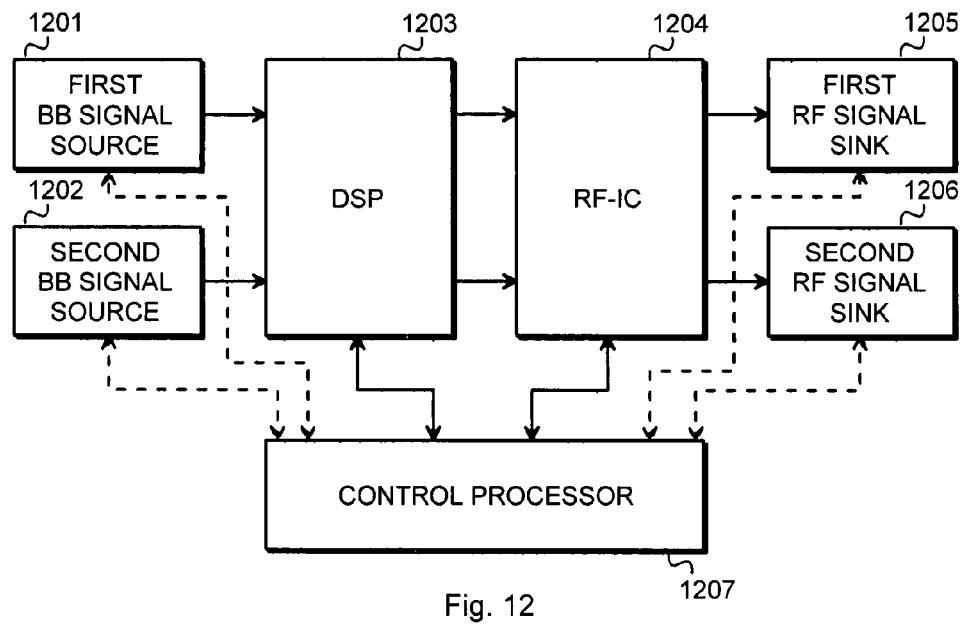
FIG. 12 illustrates an apparatus according to an embodiment of the invention.

FIG. 12 illustrates schematically a multiradio type transmitter device according to an embodiment of the invention. Signals to be transmitted in a first communications system originate in a first baseband signal source 1201, and signals to be transmitted in a second communications system originate in a second baseband signal source 1202. Baseband processing such a source encoding and channel encoding are accomplished in a digital signal processor, which here is shown as the same DSP (Digital Signal Processor) block 1203 for both kinds of signals. It is naturally possible to use different processing means for implementing baseband processing for signals to be transmitted in different communication systems.

Digital to analog conversion, modulation, amplification and filtering are accomplished in a radio frequency integrated circuit (RF-IC) 1204 and the RF signals to be transmitted are delivered to a first RF signal sink 1205 and a second RF signal sink 1206, which may be e.g. antennas or cable connections. A control block 1207 is adapted to control at least the baseband processing in the digital signal processor 1203 and the RF processing in the radio frequency integrated circuit 1204. There may be some control connections also between the control block 1207 and the baseband signal sources 1201 and 1202, and/or between the control block 1207 and the RF signal sinks 1205 and 1206.

In the architecture of FIG. 12 a measurement circuit according to an embodiment would most naturally be located within the radio frequency integrated circuit 1204, although parts of the measurement circuit (such as transmission lines, for example) may be located outside the actual integrated circuits, like directly on or within a circuit board. The signal (s) produced by the radio frequency integrated circuit 1204, which signals are indicative of the measured level(s) of the radio frequency signal(s), may be handled internally within the radio frequency integrated circuit 1204 or they can be coupled to the control block 1207, which uses them to control the operation of at least one of the digital signal processor 1203 and the radio frequency integrated circuit 1204. If calibration is part of the operation, most typically the control block 1207, which is aware of each actual transmission frequency, reads the proper, frequency-associated calibration values from a memory (not separately shown in FIG. 12) and delivers them to the appropriate programmably controllable component(s) in the radio frequency integrated circuit 1204.

Figure 13:
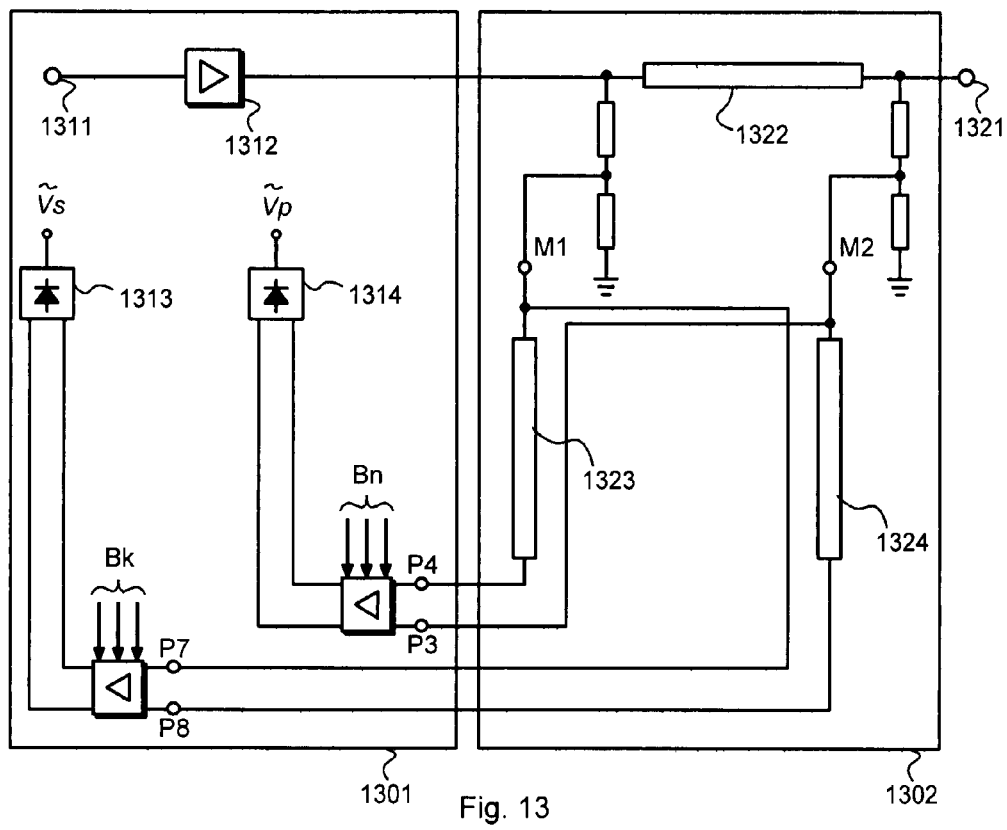
FIG. 13 illustrates a chipset according to an embodiment of the invention.

FIG. 13 illustrates a chipset according to an embodiment of the invention, comprising an active part 1301 and a passive part 1302. The active part 1301 comprises an amplifier 1312 having an input 1311. From the amplifier 1312 the amplified signal is conducted to the passive part 1302, which may include e.g. filters (not separately shown). According to an embodiment of the invention the passive part 1302 also includes a transmission phase shifter 1322 on the way that the signal passes towards an output port 1321, and sampling networks coupled to receive signals from both sides of the transmission phase shifter 1322. From the sampling networks there are paired connections to the active part 1301. In each pair, one line comprises a phase shifter part 1323 or 1324. These connections are adapted to operate according to the principle explained earlier in association with FIGS. 4a, 5, and 6, so that the signals that they carry can be conducted back to the active part 1301. Amplifiers implemented therein, as well as detectors 1313 and 1314 are adapted to produce the measurement signals, the levels of which reveal the acute degree of mismatch at the output port 1321.

The components illustrated in the drawings may be implemented with lumped circuit elements or in a more distributed manner.

The invention is adaptable to radio devices designed in a modular way, so that for example a power amplifier module according to the invention comprises the components illustrates within the active part 1301 of FIG. 13.

Figure 14:
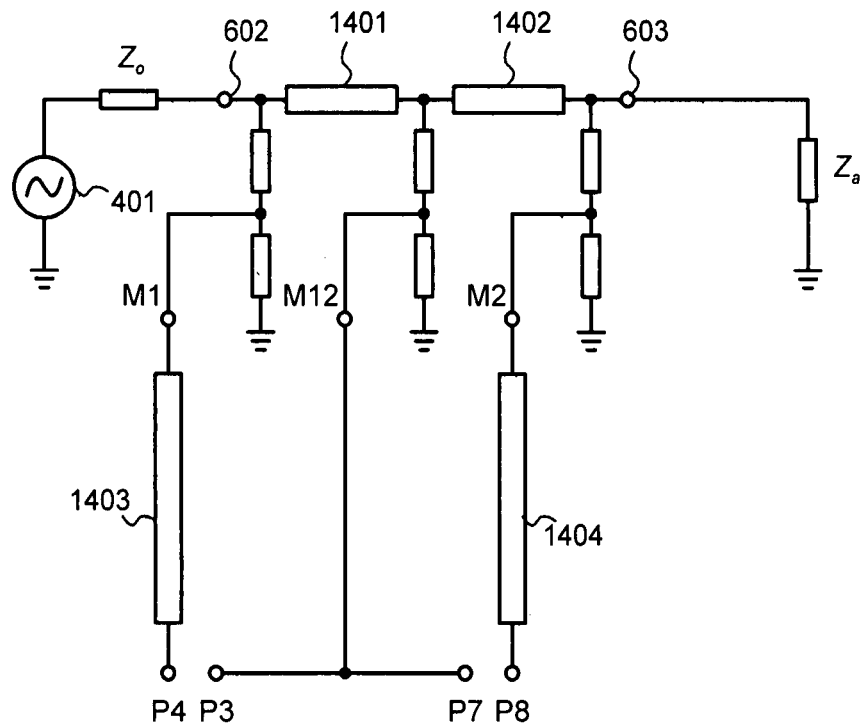
FIG. 14 illustrates an alternative embodiment of producing signal versions.

FIG. 14 illustrates an alternative way of producing the first and second signal versions that are used for the generation of the measurement signals. Instead of a single transmission phase shifter there is a series connection of two transmission phase shifters 1401 and 1402 between the input 402 and the output 403. Resistive sampling networks are coupled not only to the ends of said series coupling but also to the middle point between the transmission phase shifters 1401 and 1402. The notation used for points P3, P4, P7 and P8 corresponds to that used earlier in FIG. 6, so that point P7 connected to said middle point is to be coupled to an inverting input and point P8 connected to the load side of the transmission phase shifter arrangement is to be coupled to a non-inverting input of an amplifier (not shown) used to produce a measurement signal Vs. Similarly point P3 connected to said middle point is to be coupled to an inverting input and point P4 connected to the signal generator side of the transmission phase shifter arrangement is to be coupled to a non-inverting input of an amplifier (not shown) used to produce a measurement signal Vp. The transmission line 1403 has an electric length equal to that of the first transmission phase shifter 1401 of the series connection, and the transmission line 1404 has an electric length equal to that of the second transmission phase shifter 1402 of the series connection. As in all previously described embodiments, transmission lines can be replaced with other phase-shifting components that have the required effect on the phase of an RF signal.

Figure 15:
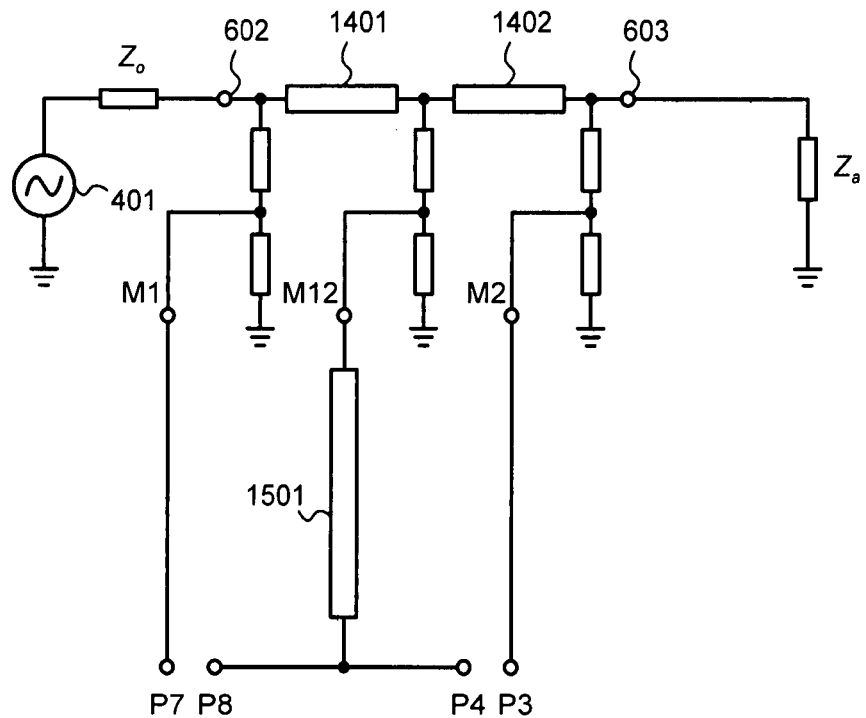
FIG. 15 illustrates another alternative embodiment of producing signal versions.

FIG. 15 illustrates yet another way of producing the first and second signal versions that are used for the generation of the measurement signals. The essential difference to the embodiment of FIG. 14 is that there is a phase-shifting transmission line 1501 in the signal line coming from the middle point between the transmission phase shifters 1401 and 1402, and no similar phase-shifting transmission lines in the signal lines coming from the endpoints of the series connection of transmission phase shifters 1401 and 1402. In this embodiment the electric lengths of all phase-shifting components 1401, 1402 and 1501 are equal. Points P4 and P8 are connected to the end of the transmission line 1501, point P3 is coupled to the load side of the transmission phase shifter arrangement, and point P4 is coupled to the signal generator side of the transmission phase shifter arrangement.

A practical difference between the embodiments of FIG. 6 on one side and the embodiments of FIGS. 14 and 15 on the other side is the number of inputs to an RF-IC, especially if the phase-shifting transmission lines are implemented on a circuit board or otherwise outside the RF-IC. As shown in FIG. 13, the approach of FIG. 6 results in four input pins to (an active part of) the RF-IC. In FIGS. 14 and 15 only a single input is needed to carry signals to both points P3 and P7 (as in FIG. 14) or points P4 and P8 (as in FIG. 15).

The invention claimed is:

1. An apparatus, comprising:
 a radio frequency signal path,
 as a part of said radio frequency signal path a transmission phase shifter,
 a measurement circuit,
 a first coupling between a first end of said transmission phase shifter and the measurement circuit,
 a second coupling between a second end of said transmission phase shifter and the measurement circuit, and
 as a part of said second coupling a first phase shifter dimensioned to produce a phase shift of same magnitude as said transmission phase shifter;
 wherein the measurement circuit is configured to combine a signal coming through said second coupling with a phase-inverted version of a signal coming through said first coupling to produce a first output signal indicative of a power level of a first radio frequency signal on said radio frequency signal path.

2. An apparatus according to claim 1, wherein the transmission phase shifter is an antenna signal transmission line having an electrical length and configured to conduct radio frequency signals on their way towards an antenna of a communications device, and said first phase shifter is a transmission line having an electrical length equal to the electrical length of said antenna signal transmission line.

3. An apparatus according to claim 1, wherein the measurement circuit comprises a first differential amplifier having a non-inverting input and an inverting input, and wherein said second coupling is coupled to said non-inverting input and said first coupling is coupled to said inverting input, and wherein an output of said first differential amplifier is configured to deliver said first output signal.

4. An apparatus according to claim 1, wherein:
the measurement circuit comprises a first amplifier having an unbalanced input and a balanced output with a positive output port and a negative output port,
the measurement circuit comprises a second amplifier having an unbalanced input and a balanced output with a positive output port and a negative output port,
said second coupling is coupled to said unbalanced input of said first amplifier and said first coupling is coupled to said unbalanced input of said second amplifier, and
the measurement circuit is configured to produce a first combined signal as a combination of signals from the positive output port of said first amplifier and signals from the negative output port of said second amplifier,
the measurement circuit is configured to produce a second combined signal as a combination of signals from the negative output port of said first amplifier and signals from the positive output port of said second amplifier, and
said first output signal is a voltage between said first combined signal and said second combined signal.

5. An apparatus according to claim 1, wherein the measurement circuit comprises one or more control inputs, and wherein the measurement circuit is configured to respond to a calibration signal brought to a control input by changing a balance between a signal coming through said second coupling and a signal coming through said first coupling.

6. An apparatus according to claim 5, wherein the measurement circuit comprises a controllable amplifier, and wherein at least one of said one or more control inputs is a bias input to said controllable amplifier.

7. An apparatus according to claim 5, wherein the measurement circuit comprises a programmable attenuator coupled to said second coupling and said first coupling, and wherein at least one of said one or more control inputs is a control input of said programmable attenuator.

8. An apparatus according to claim 1, comprising:
a third coupling between the first end of said transmission phase shifter and the measurement circuit,
a fourth coupling between the second end of said transmission phase shifter and the measurement circuit,
as a part of said third coupling a second phase shifter dimensioned to produce a phase shift of same magnitude as said transmission phase shifter;
and wherein the measurement circuit is configured to combine a signal coming through said third coupling with a phase-inverted version of a signal coming through said fourth coupling to produce a second output signal indicative of a power level of a second radio frequency signal on said radio frequency signal path.

9. An apparatus according to claim 8, wherein the transmission phase shifter is an antenna signal transmission line having an electrical length and configured to conduct radio frequency signals on their way towards an antenna of a communications device, and said second phase shifter is a transmission line having an electrical length equal to the electrical length of said antenna signal transmission line.

10. An apparatus according to claim 8, wherein the measurement circuit comprises a third differential amplifier having a non-inverting input and an inverting input, and wherein said third coupling is coupled to said non-inverting input and said fourth coupling is coupled to said inverting input, and wherein an output of said second differential amplifier is configured to deliver said second output signal.

11. An apparatus according to claim 8, wherein:
the measurement circuit comprises a third amplifier having an unbalanced input and a balanced output with a positive output port and a negative output port,
the measurement circuit comprises a fourth amplifier having an unbalanced input and a balanced output with a positive output port and a negative output port,
said third coupling is coupled to said unbalanced input of said third amplifier and said fourth coupling is coupled to said unbalanced input of said fourth amplifier, and
the measurement circuit is configured to produce a third combined signal as a combination of signals from the positive output port of said third amplifier and signals from the negative output port of said fourth amplifier,
the measurement circuit is configured to produce a fourth combined signal as a combination of signals from the negative output port of said third amplifier and signals from the positive output terminal of said fourth amplifier, and
said second output signal is a voltage between said third and fourth combined signals.

12. An apparatus according to claim 8, wherein the measurement circuit comprises one or more control inputs, and wherein the measurement circuit is configured to respond to a calibration signal brought to a control input by changing a balance between a signal coming through said fourth coupling and a signal coming through said third coupling.

13. An apparatus according to claim 12, wherein the measurement circuit comprises a controllable amplifier, and wherein at least one of said one or more control inputs is a bias input to said controllable amplifier.

14. An apparatus according to claim 12, wherein the measurement circuit comprises a programmable attenuator coupled to said fourth coupling and said third coupling, and wherein at least one of said control inputs is a control input of said programmable attenuator.

15. A communications device, comprising:
a first radio frequency signal path,
as a part of said first radio frequency signal path a first transmission phase shifter,
a second radio frequency signal path,
as a part of said second radio frequency signal path a second transmission phase shifter dimensioned to produce a phase shift of same magnitude as said first transmission phase shifter,
a measurement circuit,
a first coupling between a first end of said first transmission phase shifter and the measurement circuit,
a second coupling between a second end of said first transmission phase shifter and the measurement circuit,
as a part of said second coupling a first phase shifter dimensioned to produce a phase shift of same magnitude as any of said first and second transmission phase shifters,
a third coupling between the first end of said first transmission phase shifter and a first end of said second transmission phase shifter, said third coupling having an electrical length, and a fourth coupling between the second end of said first transmission phase shifter and a second end of said second transmission phase shifter, said fourth coupling having an electrical length equal to the electrical length of said third coupling;

wherein the measurement circuit is configured to combine a signal coming through said second coupling with a phase-inverted version of a signal coming through said first coupling to produce a first output signal indicative of a power level of a first radio frequency signal on one of said first and second radio frequency signal paths.

16. A communications device according to claim 15, comprising:

a fifth coupling between the first end of said first transmission phase shifter and the measurement circuit, a sixth coupling between the second end of said first transmission phase shifter and the measurement circuit, as a part of said fifth coupling a second phase shifter dimensioned to produce a phase shift of same magnitude as said any of said first and second transmission phase shifters;

and wherein the measurement circuit is configured to combine a signal coming through said fifth coupling with a phase-inverted version of a signal coming through said sixth coupling to produce a second output signal indicative of a power level of a second radio frequency signal on one of said first and second radio frequency signal paths.

17. A communications device according to claim 15, wherein:

the communications device comprises a control block, the measurement circuit comprises one or more control inputs, and the measurement circuit is configured to respond to a calibration signal brought from said control block to a control input by changing a balance between a signal coming through said second coupling and a signal coming through said first coupling.

18. A communications device according to claim 17, wherein said control block is configured to store a number of frequency-specific calibration signal values for calibrating the operation of the measurement circuit depending on a frequency of the radio frequency signal on one of said first and second radio frequency signal paths.

19. A chipset for use in a communications device, comprising:

a measurement circuit, a first coupling between a first end of a transmission phase shifter and the measurement circuit, a second coupling between a second end of said transmission phase shifter and the measurement circuit, as a part of said second coupling, connections to a first phase shifter dimensioned to produce a phase shift of same magnitude as said transmission phase shifter;

wherein the measurement circuit is configured to combine a signal coming through said second coupling with a phase-inverted version of a signal coming through said first coupling to produce a first output signal indicative of a power level of a first radio frequency signal going through said transmission phase shifter.

20. A chipset according to claim 19, wherein:

the chipset comprises an active part and a passive part, said measurement circuit is located in said active part, and said first and second couplings comprise components located in said passive part.

21. A method, comprising:

sampling a radio frequency signal to produce a first sampled version of the radio frequency signal, phase-shifting said radio frequency signal and sampling the phase-shifted radio frequency signal to produce a second sampled version of the phase-shifted radio frequency signal, replicating the phase-shifting of said radio frequency signal for said second sampled version, thus producing a phase-shifted second sampled version, and combining said phase-shifted second sampled version with a phase-inverted version of said first sampled version of the radio frequency signal, to produce a first output signal indicative of a power level of said radio frequency signal.

22. A method according to claim 21, comprising:

controllably producing a change of balance between said phase-shifted second sampled version and said phase-inverted version of said first sampled version of the radio frequency signal, and dimensioning said change of balance according to a previously stored control value that is associated with a frequency of said radio frequency signal.

* * * * *